United States Patent
Inoue et al.

(10) Patent No.: US 7,397,537 B2
(45) Date of Patent: Jul. 8, 2008

(54) EXPOSURE APPARATUS AND EXPOSURE METHOD

(75) Inventors: Takahiro Inoue, Nagano (JP); Hiroaki Samizu, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 234 days.

(21) Appl. No.: 11/274,963

(22) Filed: Nov. 15, 2005

(65) Prior Publication Data

US 2006/0103829 A1  May 18, 2006

(30) Foreign Application Priority Data

Nov. 18, 2004  (JP)  ............................. 2004-334320

(51) Int. Cl.
    *G03B 27/54* (2006.01)
(52) U.S. Cl. ......................................... 355/67; 355/71
(58) Field of Classification Search .................. 355/53, 355/67, 71, 77
    See application file for complete search history.

(56) References Cited

U.S. PATENT DOCUMENTS 7,061,584 B2 * 6/2006 Olszak et al. ................. 355/67
2004/0214099 A1 * 10/2004 Matsumoto .................. 430/24

FOREIGN PATENT DOCUMENTS

JP  10-112579  4/1998
JP  2004-146789  5/2004

* cited by examiner

*Primary Examiner*—Della J. Rutledge
(74) *Attorney, Agent, or Firm*—Morgan & Finnegan, LLP (57) ABSTRACT

An exposure apparatus for performing direct exposure on a relatively moving exposure target substrate comprises: a plurality of exposure heads arranged so that an overlapping exposed area occurs between exposed areas formed on the exposure target substrate as a result of exposure by the exposure heads; and light adjusting means for adjusting the amount of light to be projected from two adjacent exposure heads onto the overlapping exposed area so that the amount of the projected light becomes equal to the amount of light that a single exposure head would project onto an exposure area if the exposure area were to be exposed through the same pattern by the single exposure head alone.

12 Claims, 8 Drawing Sheets

DIRECTION OF RELATIVE MOVEMENT OF EXPOSURE TARGET SUBSTRATE

DIRECTION OF RELATIVE MOVEMENT OF EXPOSURE TARGET SUBSTRATE

DIRECTION OF RELATIVE MOVEMENT OF EXPOSURE TARGET SUBSTRATE

EXPOSURE APPARATUS AND EXPOSURE METHOD

BACKGROUND OF THE INVENTION

1. Field of the Invention

The present invention relates to an exposure apparatus, and an exposure method, for performing direct exposure, on a relatively moving exposure target substrate, using a plurality of exposure heads.

2. Description of the Related Art

Generally, a wiring pattern on a wiring substrate is formed by exposing the substrate based on design data relating to the wiring pattern and by developing and printing the desired pattern on the substrate, followed by etching. During the exposure process, photomasks are usually used. More specifically, a photosensitive resin is applied over a substrate constructed by bonding metal foil as a conductive layer onto an insulating material, and a photomask with the desired wiring pattern drawn thereon is placed over it. By exposing the thus prepared substrate, the wiring pattern defined by the photomask is transferred to the photosensitive resin on the substrate. Thereafter, by performing the steps of developing, etching, plating, etc., the metal foil on the substrate is formed as the desired wiring pattern.

In an exposure method using such a photomask, the photomask is placed in intimate contact with the substrate prior to exposure; if, at this time, any foreign matter or stain remains adhering to the substrate, the shape of the foreign matter or stain is also transferred onto the substrate. The finer the wiring pattern drawn on the substrate is, the more sensitive the photomask is to foreign matter and staining and, therefore, particularly strict management of the photomask is required. Further, if the wiring pattern is changed or damaged, a new photomask must be produced. In this case, the photomask must be produced on a trial basis a number of times by making corrections to account for the expansion, shrinkage, distortion, displacement, etc. that can occur in the substrate. The resulting increase in production cost and time has been a great burden in the production of a wiring substrate.

On the other hand, a patterning method based on direct exposure that does not use photomasks has been proposed in recent years. According to this method, as corrections for expansion, shrinkage, distortion, displacement, etc. of the substrate can be made in real time, or in advance at the exposure data generation stage, significant improvements can be achieved, for example, in enhancing the manufacturing accuracy, increasing the manufacturing yield, shortening the delivery time, and reducing the manufacturing cost.

The patterning methods based on direct exposure include, for example, methods that form an exposure pattern by direct exposure using a Digital Micromirror Device (DMD), an electron beam exposure machine, or the like.

In the prior art, one example of the patterning methods based on direct exposure that use the DMD is disclosed in Japanese Unexamined Patent Publication No. 10-112579. According to the technique disclosed therein, when directly exposing the photoresist formed on an exposure target substrate, pattern data corresponding to the pattern to be exposed is generated and this pattern data is input to the Digital Micromirror Device (DMD), causing each of the micromirrors arranged thereon to tilt according to the pattern data and thereby changing the direction of the light, reflected by each micromirror on the DMD, as needed; the light thus controlled is projected onto the resist on the exposure target substrate to form an exposure pattern that matches the pattern data.

Figure 8:
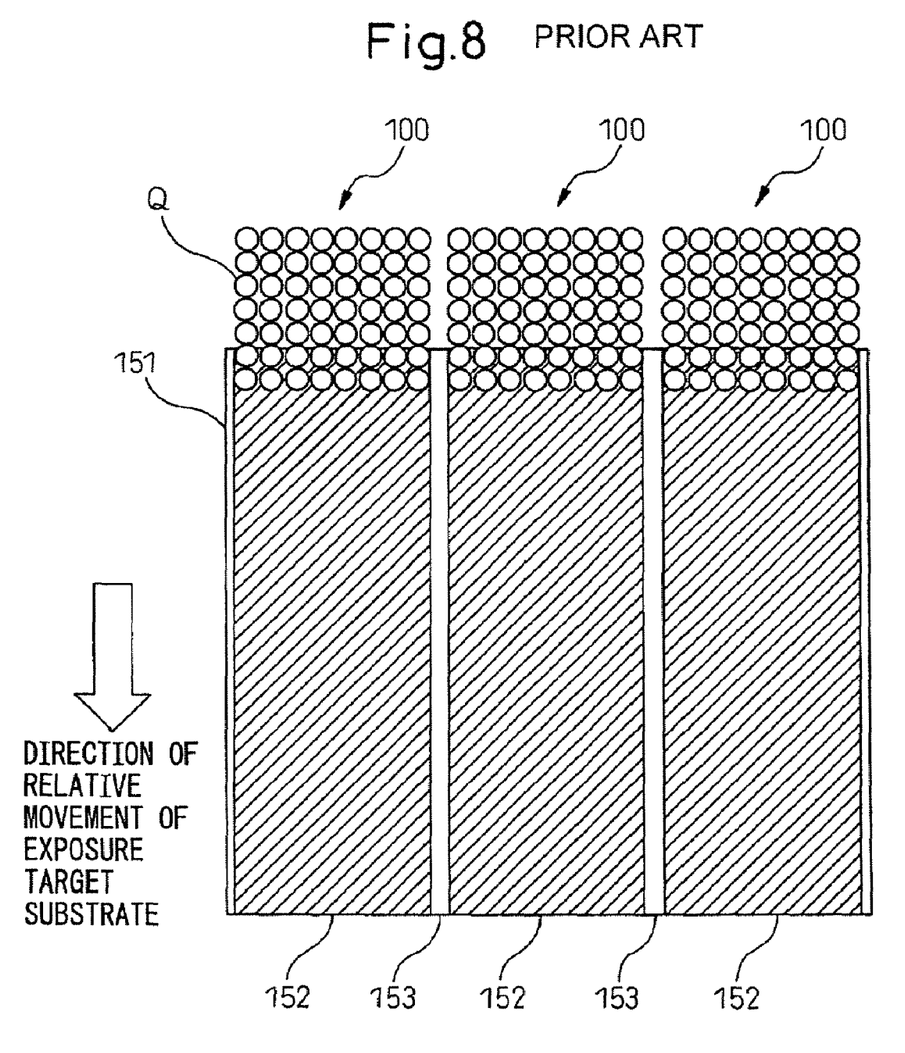
FIG. 8 is a diagram showing, by way of example, exposed areas formed by an exposure apparatus according to the prior art.

FIG. 8 is a diagram showing, by way of example, exposed areas formed by an exposure apparatus according to the prior art. In the figure, DMD micromirrors in each exposure head 100 constructed from the DMD are indicated by open circles (reference character Q). In this and other figures, the number of exposure heads, the number of micromirrors in each exposure head, and their relative sizes are shown for illustrative purposes only. As, usually, the entire area of the exposure target substrate 151 cannot be exposed by a single exposure head 100, a plurality of exposure heads 100 are arranged in a direction orthogonal to the direction of the relative movement of the exposure target substrate 151, and the exposure is performed using these exposure heads 100. In the figure, the area exposed by each exposure head 100 (hereinafter called the "exposed area", indicated by reference numeral 152) is shown by oblique hatching. The area that can be illuminated by the micromirrors Q in each exposure head 100 is limited, and there occurs a spatial gap between each exposure head 100 due to the nature of its structure; here, if the gap between each exposure head 100 is large, an area left unexposed (hereinafter called the "unexposed area", indicated by reference numeral 153) occurs on the exposure target substrate 151, as shown in FIG. 8. On the other hand, if the gap between each exposure head 100 is too small, an area (not shown) that simultaneously receives light from two adjacent exposure heads occurs on the exposure target substrate, and such an area is subjected to a larger amount of light than necessary compared with other areas.

Japanese Unexamined Patent Publication No. 2004-146789 discloses a technique that projects an equal amount of light over the entire exposure surface by moving a single exposure head back and forth for exposure in such a manner that adjacent exposed areas overlap each other.

However, in the exposure apparatus in which a plurality of exposure heads are arranged, the occurrence of the unexposed area due to the gap between each exposure head and the unevenness in the amount of projected light are undesirable because these can significantly affect the quality of the wiring substrate as a finished product.

On the other hand, the technique disclosed in Japanese Unexamined Patent Publication No. 2004-146789, which aims at projecting an equal amount of light over the entire exposure surface, requires that the exposure head be moved back and force, i.e., in two directions, not in one direction, relative to the exposure target substrate, and also that the movements be repeated a plurality of times; therefore, this prior art technique has the shortcoming that not only does it take a longer time to complete the exposure of one exposure target substrate, but the apparatus becomes complex in construction because of the provision of the mechanism for the back and forth movements.

Accordingly, in view of the above problem, it is an object of the present invention to provide an exposure apparatus and an exposure method for performing direct exposure using a plurality of exposure heads, wherein provisions are made to be able to accomplish the direct exposure at high speed while ensuring that no unexposed areas occur on the exposure target substrate moving relative to the exposure heads.

SUMMARY OF THE INVENTION

To achieve the above object, according to the present invention, direct exposure is performed on the relatively moving exposure target substrate by using the exposure heads that are arranged so that an overlapping exposed area occurs between adjacent exposed areas after the exposure. Then, the amount of light to be projected onto the exposure target substrate is adjusted so that the amount of light to be projected from the two adjacent exposure heads that contribute to the formation of the overlapped exposed area becomes equal to the amount of light that a single exposure head would project onto an exposure area if the exposure area were to be exposed through the same pattern by the single exposure head alone.

Figure 1A:
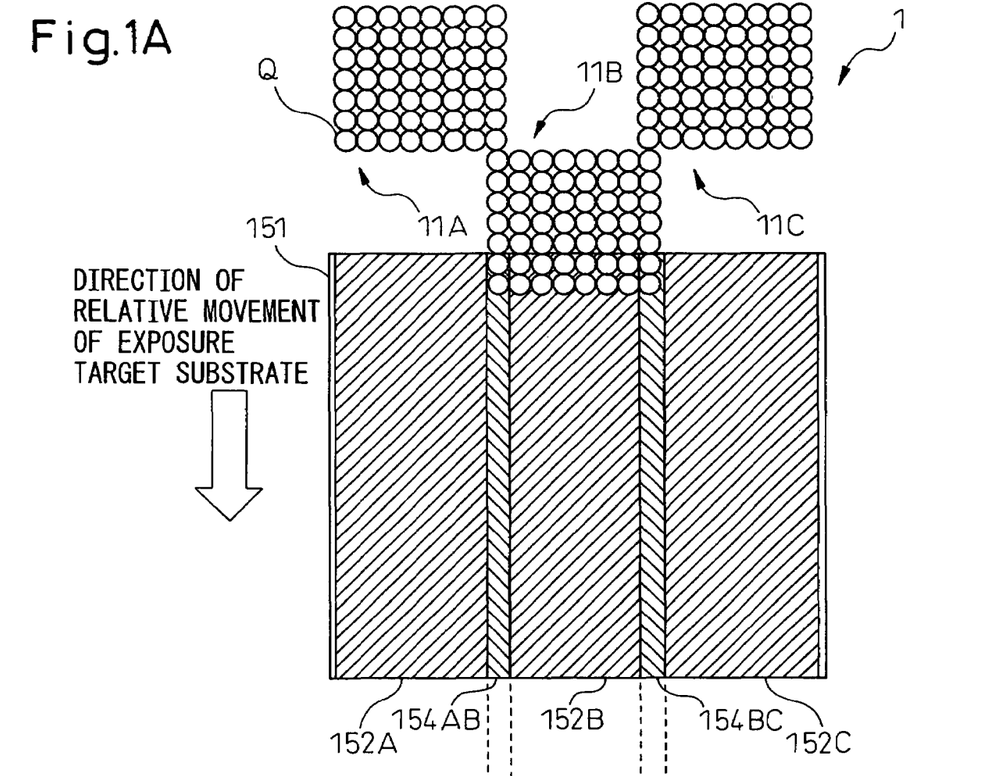
FIG. 1A is a front view showing the exposure heads arranged on the side opposite the exposure target substrate.

FIGS. 1A, 1B, 1C, 1D and 1E are diagrams for explaining the operating principle of an exposure apparatus according to the present invention. FIG. 1A schematically shows the exposure heads 11A, 11B, and 11C arranged on the side opposite the exposure target substrate 151. In the figure, the number of exposure devices Q (indicated by open circles in the figure) and the number of exposure heads are for illustrative purposes only, and this also applies to the other figures given herein.

As shown in FIG. 1A, according to the present invention, the exposure apparatus 1 for performing direct exposure on the relatively moving exposure target substrate 151 comprises: the plurality of exposure heads 11A, 11B, and 11C arranged so that overlapping exposed areas 154AB and 154BC occur between the respective exposed areas formed on the exposure target substrate 151 as a result of exposure by the respective exposure heads 11A, 11B, and 11C; and light adjusting means (not shown) for adjusting the amount of light to be projected from each pair of adjacent exposure heads 11 onto a corresponding one of the overlapping exposed areas 154AB and 154BC so that the amount of the projected light becomes equal to the amount of light that a single exposure head would project onto an exposure area if the exposure area were to be exposed through the same pattern by the single exposure head alone. In this way, according to the present invention, the exposure heads 11A, 11B, and 11C are arranged so that the overlapping exposed areas 154AB and 154BC occur due to the projection of light from the respective pairs of adjacent exposure heads, that is, so that the exposure heads overlap each other along the direction perpendicular to the direction of the relative movement of the exposure target substrate.

FIGS. 1B, 1C, 1D, and 1E show, by way of example, the amount of light projected from the exposure head 11A, the amount of light projected from the exposure head 11B, the amount of light projected from the exposure head 11C, and the sum of the amounts of light, respectively.

Generally, in a direct exposure apparatus, of the exposure devices in each exposure head, the exposure devices arrayed along the direction of the relative movement of the exposure target substrate contribute to the direct exposure at a prescribed position on the exposure target substrate. In the present invention, the light adjusting means adjusts the amount of light to be projected from each exposure device in the exposure head so that the amount of light projected from the exposure devices arranged on the same line along the direction of the relative movement and responsible for the projection of light on the overlapping exposed area becomes approximately equal to the amount of light projected from the exposure devices arranged on another line and responsible for the projection of light on an exposed area other than the overlapping exposed area, irrespective of the difference between the numbers of exposure devices arranged on the respective lines. More specifically, the number of exposure devices arranged on the line contributing to the projection of light on the overlapping exposed area is larger than the number of exposure devices arranged on the line contributing to the projection of light on the exposed area other than the overlapping exposed area, but in the present invention, when performing exposure based on the same exposure data, the amount of light to be projected from each exposure device is controlled so that the accumulated amount of projected light necessary for exposure will become the same for any line of exposure devices.

Figures 1B, 1C:
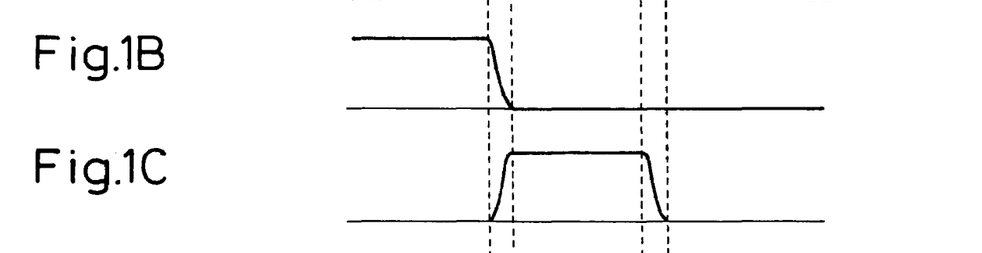
FIG. 1B is a diagram showing the amount of light projected from the exposure head 11A.
FIG. 1C is a diagram showing the amount of light projected from the exposure head 11B.

For example, in the overlapping exposed area 154AB for which the exposure head 11A is responsible, the amount of light to be projected from the exposure head 11A for exposure is set so as to decrease toward the exposed area's edge overlapping into the exposure head 11B, as shown in FIG. 1B. Likewise, in the overlapping exposed area 154AB for which the exposure head 11B is responsible, the amount of light to be projected from the exposure head 11B for exposure is set so as to decrease toward the exposed area's edge overlapping into the exposure head 11A, as shown in FIG. 1C, while in the overlapping exposed area 154BC, the amount of light to be projected is set so as to decrease toward the exposed area's edge overlapping into the exposure head 11C. Further, in the overlapping exposed area 154BC for which the exposure head 11C is responsible, the amount of light to be projected from the exposure head 11C for exposure is set so as to decrease toward the exposed area's edge overlapping into the exposure head 11B, as shown in FIG. 1D.

Figure 1D:
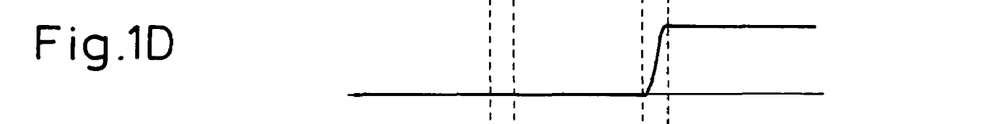
FIG. 1D is a diagram showing the amount of light projected from the exposure head 11C.
Figure 1E:
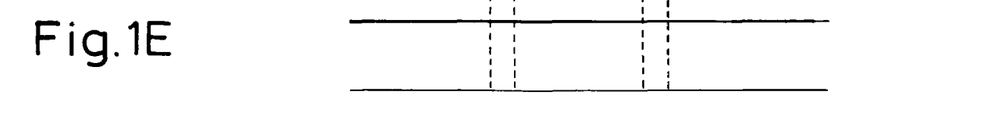
FIG. 1E is a diagram showing the sum of the amounts of light.

In the overlapping exposed areas 154AB and 154BC, the light adjusting means adjusts the amount of projected light so that the sum of the amounts of projected light respectively shown in FIGS. 1B to 1D becomes equal to the amount of projected light shown in FIG. 1E, i.e., the amount of light that the single exposure head 11A, 11B, or 11C projects onto the exposed area 152A, 152B, or 152C for which the single exposure head 11A, 11B, or 11C alone is responsible. In the example shown in FIGS. 1B to 1D, the amounts of projected light are each shown as an increasing or decreasing function describing a gentle curve, but instead, another suitable function such as a linear function may be employed.

BRIEF DESCRIPTION OF THE DRAWINGS

The present invention will be more clearly understood from the description as set forth below with reference to the accompanying drawings, wherein:

FIGS. 1A, 1B, 1C, 1D and 1E are diagrams for explaining the operating principle of an exposure apparatus according to the present invention; more specifically.

FIGS. 2A, 2B, 2C and 2D are diagrams for explaining the operating principle of an exposure apparatus according to a first embodiment of the present invention; more specifically.

FIGS. 4A, 4B, 4C and 4D are diagrams for explaining the operating principle of an exposure apparatus according to one prior art example; more specifically.

FIGS. 5A, 5B, 5C and 5D are diagrams for explaining the operating principle of an exposure apparatus according to a third embodiment of the present invention; more specifically.

FIGS. 7A, 7B, 7C and 7D are diagrams for explaining the case where the exposure heads have become displaced from the set position in the exposure apparatus of the first embodiment of the present invention shown in FIG. 2A; more specifically.

DESCRIPTION OF THE PREFERRED EMBODIMENTS

In each embodiment of the present embodiment described herein, it is assumed that the exposure head in the exposure apparatus is of the type that uses the DMD. In this case, each micromirror on the DMD corresponds to each of the exposure devices Q arranged in a two-dimensional array. The number of micromirrors on the DMD, that is, the number of exposure devices (pixels), is, for example, 848×600 pixels in the case of the DMD of an SVGA type, 1024×768 pixels in the case of the DMD of an XGA type, and 1280×1024 pixels in the case of the DMD of an SXGA type.

Figures 2A, 2B:
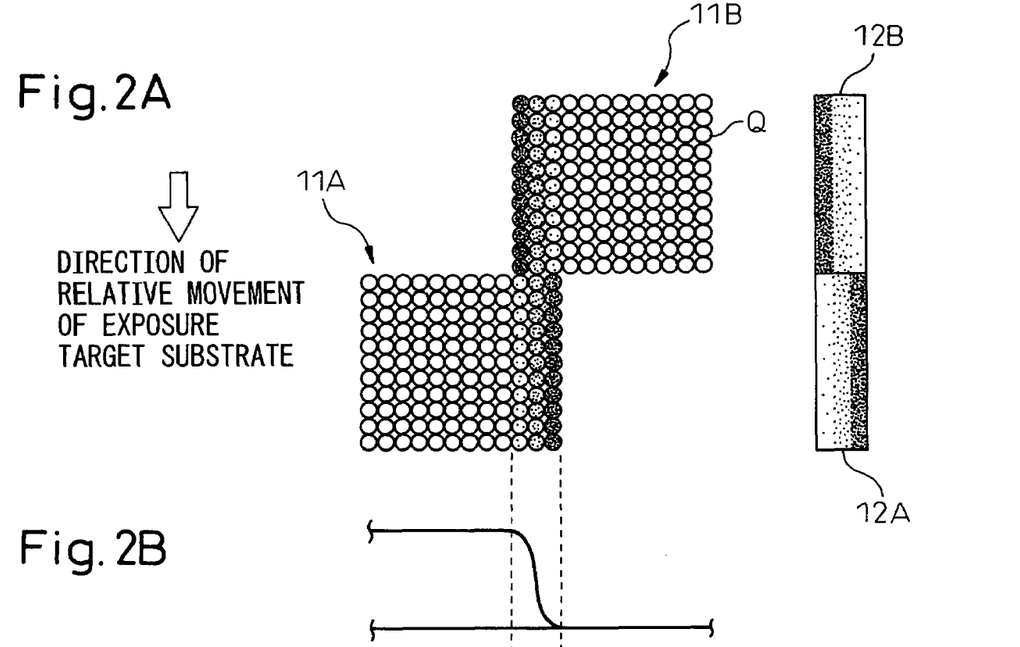
FIG. 2A is a front view showing, by way of example, exposure heads and filters as viewed from the side opposite an exposure target substrate.
FIGS. 2B and 2C are diagrams showing the amounts of light projected from the respective exposure heads.
Figure 2C:
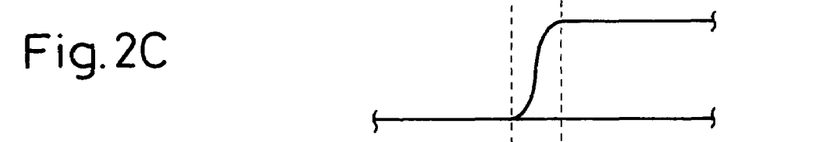
Figure 2D:
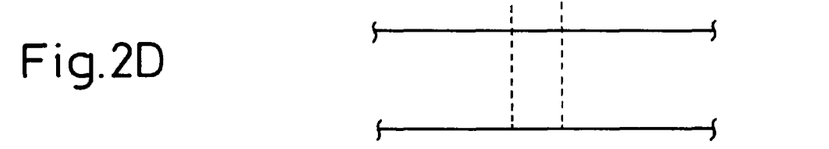
FIG. 2D is a diagram showing the sum of the amounts of light projected from the respective exposure heads.

FIGS. 2A, 2B, 2C and 2D are diagrams for explaining the operating principle of an exposure apparatus according to a first embodiment of the present invention; more specifically, FIG. 2A is a front view showing, by way of example, exposure heads and filters as viewed from the side opposite the exposure target substrate (not shown), FIGS. 2B and 2C are diagrams showing the amounts of light projected from the respective exposure heads, and FIG. 2D is a diagram showing the sum of the amounts of light projected from the respective exposure heads.

In this embodiment, light adjusting means is implemented using the filters 12A and 12B that are disposed between the exposure target substrate (not shown) and the respective exposure heads 11A and 11B, and that can adjust the transmittance of light being projected from the respective exposure heads 11A and 11B toward the exposure target substrate.

The exposure heads 11A and 11B are arranged so that an overlapping exposed area occurs between the exposed areas formed by the respective exposure heads 11A and 11B.

The amounts of light that the exposure heads 11A and 11B project onto the exposure target substrate for exposure are adjusted by the respective filters 12A and 12B as the light adjusting means so that the sum of the amount of light projected from the exposure head 11A (FIG. 2B) and the amount of light projected from the exposure head 11B (FIG. 2C), in the overlapping exposed area, becomes approximately equal to the amount of light that a single exposure head would project onto an exposure area if the exposure area were to be exposed through the same pattern by the single exposure head alone. That is, in the present embodiment, the filters 12A and 12B are each constructed so that the transmittance becomes lower for the light passing through the filter area closer to the exposure head 11A or 11B whichever is adjacent to the corresponding exposure head. Specific examples of such filters include filters constructed from films having gradations in shade and filters constructed from liquid crystal displays. In particular, if the filters of the present embodiment are constructed from liquid crystal displays, such filters are also suitable for applications that implement extended functions, because the transmittance of light can be varied as desired.

Figure 3:
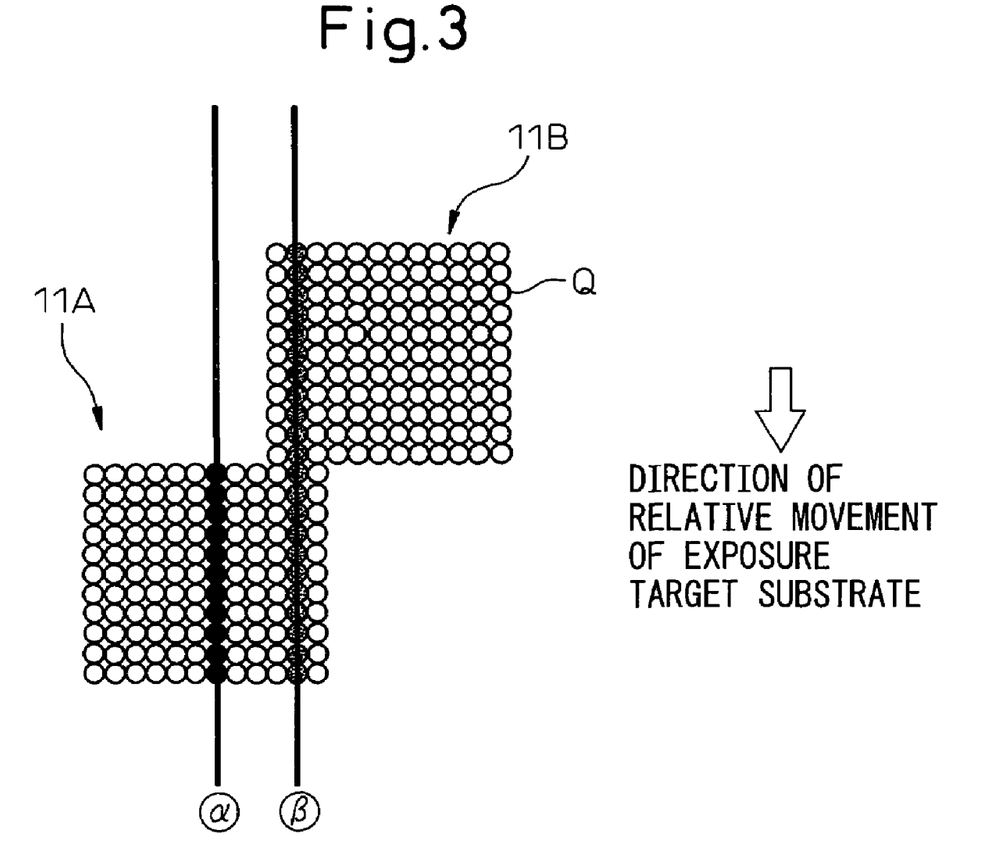
FIG. 3 is a diagram for explaining the operating principle of an exposure apparatus according to a second embodiment of the present invention.

FIG. 3 is a diagram for explaining the operating principle of an exposure apparatus according to a second embodiment of the present invention.

The light adjusting means in this embodiment adjusts the amount of light to be projected onto the exposure target substrate (not shown) by controlling the ON and OFF times of each exposure device Q in the respective exposure heads 11A and 11B. Generally, in a direct exposure apparatus, of the exposure devices in each exposure head the exposure devices arrayed along the direction of the relative movement of the exposure target substrate contribute to the direct exposure at a prescribed position on the exposure target substrate. As shown in FIG. 3, in the present embodiment, the ON and OFF times of each exposure device Q are controlled so that the amount of light projected from the exposure devices Q arranged on a line β becomes approximately equal to the amount of light projected from the exposure devices Q arranged on a line α, irrespective of the difference between the numbers of exposure devices arranged on the respective lines. More specifically, the number of exposure devices Q arranged on the line β is larger than the number of exposure devices Q arranged on the line α, but in the present embodiment, when performing exposure based on the same exposure data (same pattern), the ON and OFF times of each exposure device Q in the respective exposure heads 11A and 11B are controlled so that the amount of light projected from the exposure devices Q arranged on the line β becomes approximately equal to the amount of light projected from the exposure devices Q arranged on the line α.

In a specific example, when each exposure head is constructed, for example, from a Digital Micromirror Device, the light adjusting means may be configured to adjust the amount of light to be projected onto the exposure target substrate by controlling the light output of the light source that projects the light onto the Digital Micromirror Device, or alternatively, the micromirrors on the Micromirror Device may be caused to tilt in order to control the direction of the light reflected by each micromirror, thereby controlling the amount of light to be projected onto the exposure target substrate. Further, when the exposure head itself is constructed from light sources, the light adjusting means may be configured to control the light output of each light source.

Third and fourth embodiments of the present invention will be described below.

As is known, from the prior art, in order to enable direct exposure to be performed with a resolution smaller than the spacing of the exposure devices, it is practiced to move the exposure target substrate by tilting it by a prescribed angle relative to the exposure heads each comprising an array of a plurality of exposure devices. The third and fourth embodiments are embodiments of the present invention as applied to such cases.

Figure 4A:
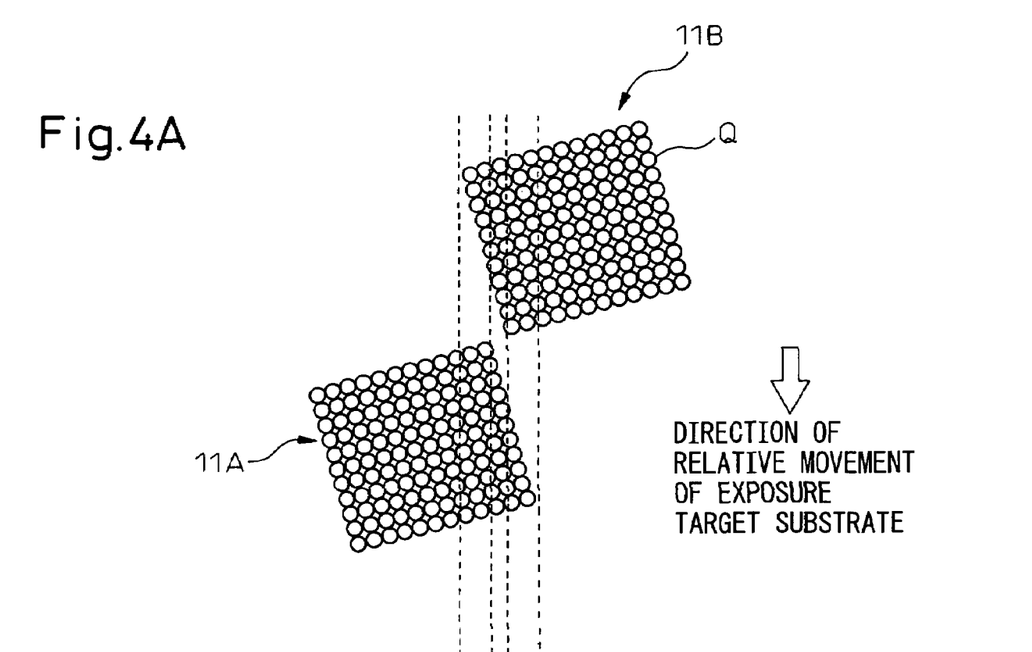
FIG. 4A is a front view showing, by way of example, exposure heads as viewed from the side opposite the exposure target substrate (not shown)
Figure 4B:
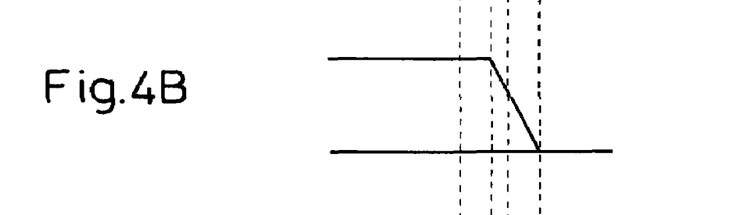
FIGS. 4B and 4C are diagrams showing the amounts of light projected from the respective exposure heads.
Figures 4C, 4D:
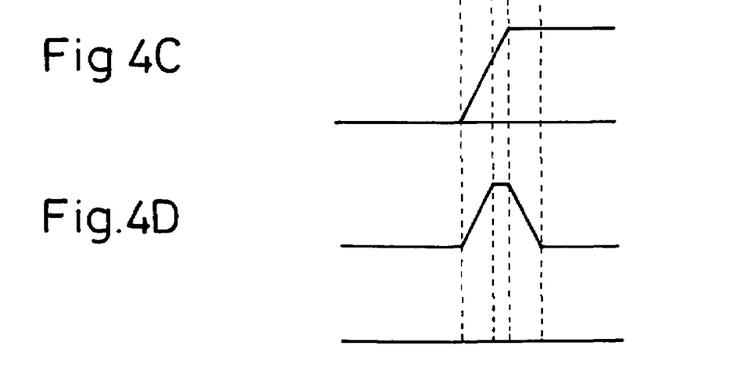
FIG. 4D is a diagram showing the sum of the amounts of light projected from the respective exposure heads.
Figure 5A:
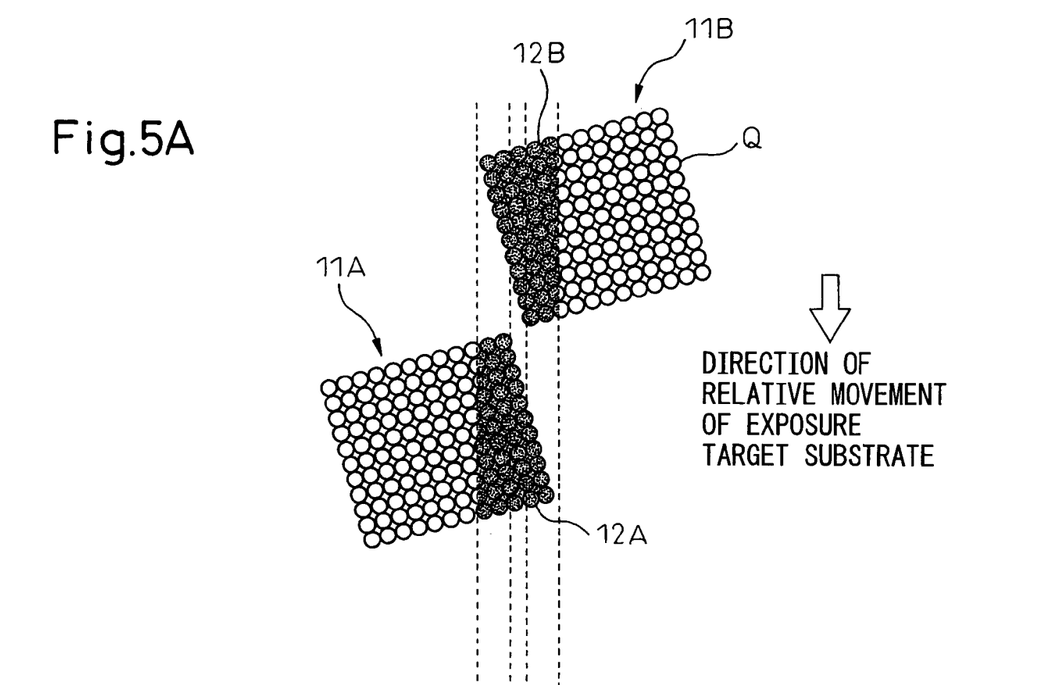
FIG. 5A is a front view showing, by way of example, exposure heads and filters as viewed from the side opposite the exposure target substrate.
Figure 5B:
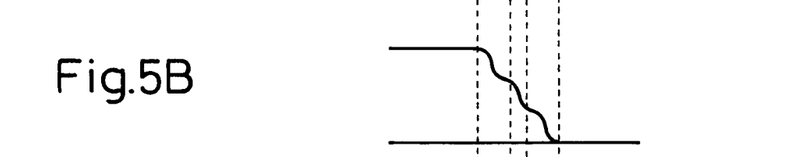
FIGS. 5B and 5C are diagrams showing the amounts of light projected from the respective exposure heads.
Figure 5C:
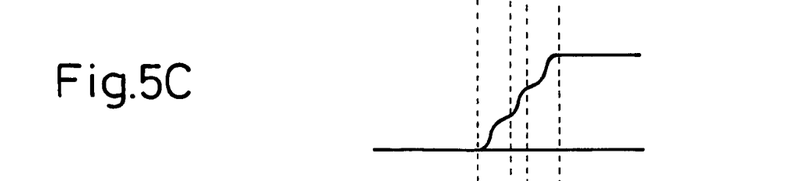
Figure 5D:
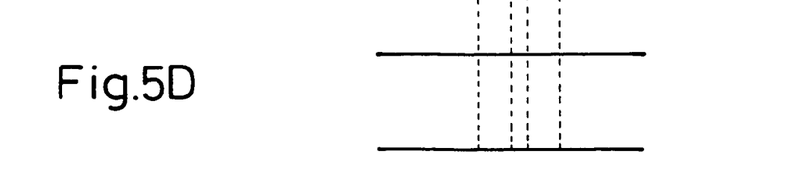
FIG. 5D is a diagram showing the sum of the amounts of light projected from the respective exposure heads.

FIGS. 4A, 4B, 4C and 4D are diagrams for explaining the operating principle of an exposure apparatus according to one prior art example; more specifically, FIG. 4A is a front view showing, by way of example, the exposure heads as viewed from the side opposite the exposure target substrate (not shown), FIGS. 4B and 4C are diagrams showing the amounts of light projected from the respective exposure heads, and FIG. 4D is a diagram showing the sum of the amounts of light projected from the respective exposure heads. On the other hand, FIGS. 5A, 5B, 5C and 5D are diagrams for explaining the operating principle of the exposure apparatus according to the third embodiment of the present invention; more specifically, FIG. 5A is a front view showing, by way of example, the exposure heads and filters as viewed from the side opposite the exposure target substrate (not shown), FIGS. 5B and 5C are diagrams showing the amounts of light projected from the respective exposure heads, and FIG. 5D is a diagram showing the sum of the amounts of light projected from the respective exposure heads. FIGS. 4B to 4D and FIGS. 5B to 5D each show the amount of light projected onto the exposure target substrate moving by being tilted at a prescribed angle relative to the exposure heads.

In the case of the prior art example where the amount of light that each of the exposure heads 11A and 11B projects onto the overlapping area for exposure increases or decreases in accordance with a linear function as shown in FIGS. 4B and 4C, the sum of the amounts of light projected onto the overlapping area becomes larger, as shown in FIG. 4D, than the amount of light that a single exposure head would project onto an exposure area if the exposure area were to be exposed through the same pattern by the single exposure head alone. In view of this, in the present embodiment, the filters 12A and 12B described in the first embodiment are provided as shown in FIG. 5A, and the amounts of light projected from the respective exposure heads 11A and 11B are controlled so as to increase or decrease appropriately as shown in FIGS. 5B and 5C so that the sum of the amounts of light becomes equal to that shown in FIG. 5D.

Figure 6:
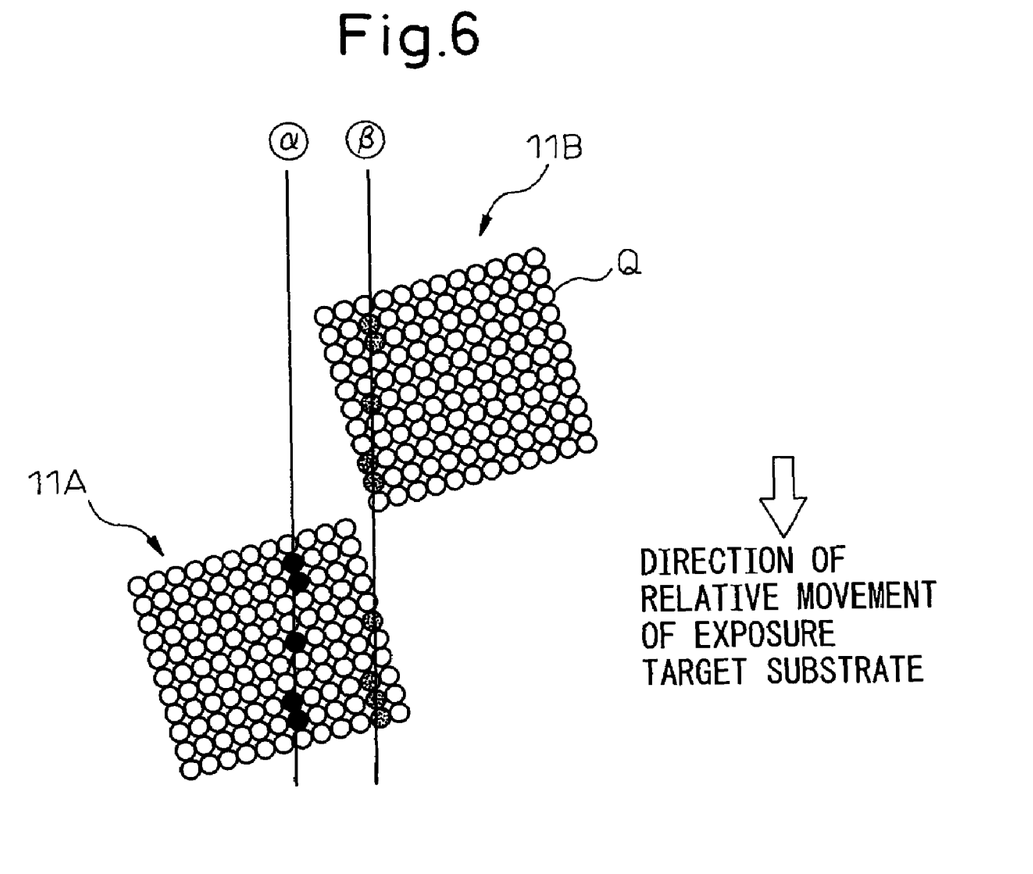
FIG. 6 is a diagram for explaining the operating principle of an exposure apparatus according to a fourth embodiment of the present invention.

FIG. 6 is a diagram for explaining the operating principle of the exposure apparatus according to the fourth embodiment of the present invention. In this embodiment, the ON and OFF times of each exposure device Q are controlled so that the amount of light projected from the exposure devices Q arranged on the line β becomes equal to the amount of projected light from the exposure devices Q arranged on the line α, irrespective of the difference between the numbers of exposure devices arranged on the respective lines.

As described above, according to the first to fourth embodiments of the present invention, by using the plurality of exposure heads, direct exposure can be performed at high speed on the exposure target substrate moving in relative fashion in one direction, while ensuring that no unexposed areas occur on the exposure target substrate and that a uniform amount of exposure light is projected over the entire area.

Figure 7A:
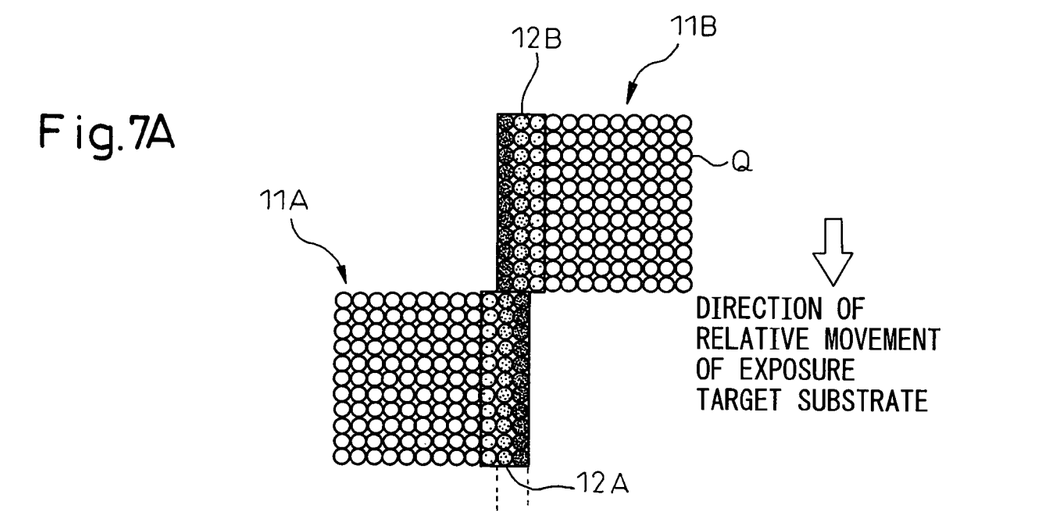
FIG. 7A is a front view showing, by way of example, the exposure heads and filters as viewed from the side opposite the exposure target substrate (not shown)
Figures 7B, 7C:
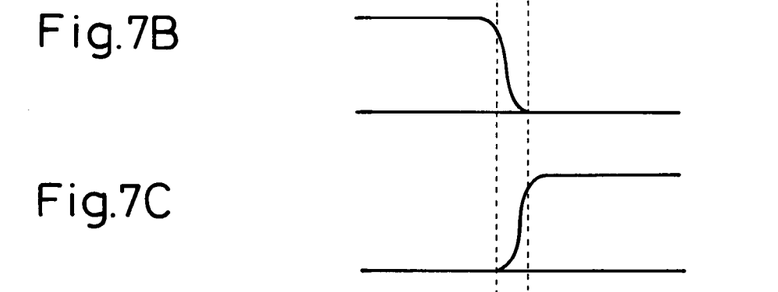
FIGS. 7B and 7C are diagrams showing the amounts of light projected from the respective exposure heads.
Figure 7D:
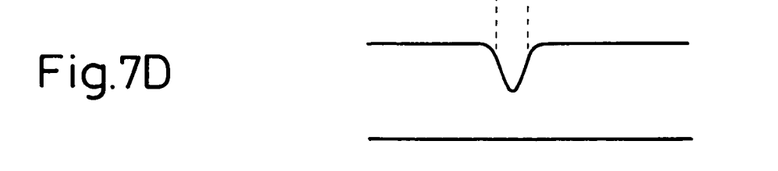
FIG. 7D is a diagram showing the sum of the amounts of light projected from the respective exposure heads.

However, even when the apparatus is constructed to achieve direct exposure free from the occurrence of unexposed areas by arranging the exposure head and using the light adjusting means as described above, there can occur cases where the set position of the respective exposure heads becomes gradually displaced as the apparatus is used. FIGS. 7A, 7B, 7C and 7D are diagrams for explaining the case where the exposure heads have become displaced from the set position in the exposure apparatus of the first embodiment of the present invention shown in FIG. 2; more specifically, FIG. 7A is a front view showing, by way of example, the exposure heads and filters as viewed from the side opposite the exposure target substrate (not shown), FIGS. 7B and 7C are diagrams showing the amounts of light projected from the respective exposure heads, and FIG. 7D is a diagram showing the sum of the amounts of light projected from the respective exposure heads.

When the respective exposure heads 11A and 11B become displaced as shown in FIG. 7A, the amounts of projected light also become displaced as shown in FIGS. 7B and 7C, and as a result, the sum of the amounts of projected light becomes smaller, as shown in FIG. 7D, than what it would normally be (that is, the sum shown in FIG. 2D). However, unlike the case of the prior art, an unexposed area, i.e., an area where no light is received, does not occur and, while there is a certain degree of variation in the amount of projected light, the possibility that the above displacement will have a serious effect on the final exposure result is small. This is because, in the direct exposure apparatus, of the exposure devices in each exposure head the exposure devices arrayed along the direction of the relative movement of the exposure target substrate contribute to the direct exposure at a prescribed position on the exposure target substrate, that is, a plurality of exposure devices contribute to the direct exposure at any position on the exposure target substrate and, because whether the intended exposure process is completed or not is determined by whether the light energy accumulated through the plurality of exposures from the respective exposure devices exceeds the threshold for exposing the photoresist applied over the exposure target substrate. Accordingly, if the number of exposure devices arranged on the line along the direction of the relative movement is sufficiently large, the possibility that the above displacement will have a serious effect on the final exposure result becomes even smaller. Such a redundancy in the number of exposure devices provides the basis for the reliability of the direct exposure apparatus.

In the above embodiments, the exposure apparatus has been described as using the DMD for the exposure head, but using the DMD itself does not restrict the present invention. As an alternative example, the exposure head may be implemented using a liquid crystal device having a function equivalent to that of the DMD.

As described above, according to the present invention, direct exposure can be performed at high speed using a plurality of exposure heads so that no unexposed areas occur on the exposure target substrate moving in one direction relative to the exposure heads. According to the direct exposure, high-precision wiring formation can be accomplished easily and at high speed, and the wiring density can be increased. Accordingly, the present invention is best suited to applications where complicated wiring patterns that require particularly high precision are formed by direct exposure, and the invention can also satisfactorily address the future need for superfine wiring and the resulting increase in the amount of exposure data.

What is claimed is:

1. An exposure apparatus for performing direct exposure on a relatively moving exposure target, comprising:
    a plurality of exposure heads arranged so that an overlapping exposed area occurs between exposed areas formed on said exposure target as a result of exposure by said exposure heads; and
    light adjusting means for adjusting the amount of light to be projected from two adjacent ones of said exposure heads onto said overlapping exposed area so that the amount of said projected light becomes equal to the amount of light that a single exposure head would project onto an exposure area if said exposure area were to be exposed through the same pattern by said single exposure head alone, wherein each of said exposure heads is constructed from a digital micromirror device, and said light adjusting means is disposed between said exposure target and said exposure heads, and is constructed from a filter capable of adjusting the transmittance of light being projected from said exposure heads toward said exposure target.

2. An exposure apparatus according to claim 1, wherein said filter is constructed from films having gradations in shade.

3. An exposure apparatus according to claim 1, wherein said filter is constructed from liquid crystal display.

4. An exposure apparatus for performing direct exposure on a relatively moving exposure target, comprising:
   a plurality of exposure heads arranged so that an overlapping exposed area occurs between exposed areas formed on said exposure target as a result of exposure by said exposure heads; and
   light adjusting means for adjusting the amount of light to be projected from two adjacent ones of said exposure heads onto said overlapping exposed area so that the amount of said projected light will yield an exposure result equivalent to the result that would be obtained from a single exposure head if said exposed area were to be exposed by said single exposure head alone,
   wherein each of said exposure heads is constructed from a digital micromirror device, and said light adiusting means is disposed between said exposure target and said exposure heads, and is constructed from a filter capable of adjusting the transmittance of light being projected from said exposure heads toward said exposure target.

5. An exposure apparatus according to claim 4, wherein said filter is constructed from films having gradations in shade.

6. An exposure apparatus according to claim 4, wherein said filter is constructed from liquid crystal display.

7. An exposure apparatus for performing direct exposure on a relatively moving exposure target, comprising:
   a plurality of exposure heads arranged so that an overlapping exposed area occurs as a result of exposure by two adjacent ones of said exposure heads; and
   light adjusting means for adjusting the amount of light to be projected from said two exposure heads onto said overlapping exposed area so that the amount of said projected light becomes equal to the amount of light that a single exposure head would project onto an exposure area if said exposure area were to be exposed through the same pattern by said single exposure head alone,
   wherein each of said exposure heads is constructed from a digital micromirror device, and said light adjusting means is disposed between said exposure target and said exposure heads, and is constructed from a filter capable of adjusting the transmittance of light being projected from said exposure heads toward said exposure target.

8. An exposure apparatus according to claim 7, wherein said filter is constructed from films having gradations in shade.

9. An exposure apparatus according to claim 7, wherein said filter is constructed from liquid crystal display.

10. An exposure method for performing direct exposure on a relatively moving exposure target, wherein using a plurality of exposure heads arranged so that an overlapping exposed area occurs between adjacent exposed areas after exposure, light is projected onto said exposure target by adjusting the amount of light to be projected from two adjacent ones of said exposure heads onto said overlapping exposed area so that the amount of said projected light becomes equal to the amount of light that a single exposure head would project onto an exposure area if said exposure area were to be exposed by said single exposure head alone,
    wherein each of said exposure heads is constructed from a digital micromirror device, and said light adjusting means is disposed between said exposure target and said exposure heads, and is constructed from a filter capable of adjusting the transmittance of light being projected from said exposure heads toward said exposure target.

11. An exposure apparatus according to claim 10, wherein said filter is constructed from films having gradations in shade.

12. An exposure apparatus according to claim 10, wherein said filter is constructed from liquid crystal display.

* * * * *

UNITED STATES PATENT AND TRADEMARK OFFICE
CERTIFICATE OF CORRECTION

| | |
|---|---|
| PATENT NO. | : 7,397,537 B2 |
| APPLICATION NO. | : 11/274963 |
| DATED | : July 8, 2008 |
| INVENTOR(S) | : Inoue et al. |

Page 1 of 1

It is certified that error appears in the above-identified patent and that said Letters Patent is hereby corrected as shown below:

In claim 4 (i.e., col. 9, line 30), please delete the word "adiusting" and insert therefore -- adjusting --.

Signed and Sealed this

Fourteenth Day of July, 2009

JOHN DOLL
*Acting Director of the United States Patent and Trademark Office*